(12) United States Patent
Prevey et al.

(10) Patent No.: US 7,219,044 B1
(45) Date of Patent: May 15, 2007

(54) METHOD AND SYSTEM FOR IMPROVING A PART'S RESISTANCE TO STRESS INDUCED FAILURE

(75) Inventors: Paul S. Prevey, Cincinnati, OH (US); Nayaraman Jayaraman, Cincinnati, OH (US); Douglas J. Hornbach, Guilford, IN (US)

(73) Assignee: Surface Technology Holdings, Ltd., Cincinnati, OH (US)

( * ) Notice: Subject to any disclaimer, the term of this patent is extended or adjusted under 35 U.S.C. 154(b) by 264 days.

(21) Appl. No.: 10/960,246

(22) Filed: Oct. 7, 2004

(51) Int. Cl.
*G06G 7/48* (2006.01)
(52) U.S. Cl. .............................. 703/7; 73/804
(58) Field of Classification Search .............. 703/7; 148/95, 516; 378/72; 73/804, 789, 788
See application file for complete search history.

(56) References Cited

U.S. PATENT DOCUMENTS

| | | | | |
|---|---|---|---|---|
| 4,354,371 A | * | 10/1982 | Johnson | 72/53 |
| 4,953,973 A | * | 9/1990 | Leftheris et al. | 356/32 |
| 5,625,664 A | * | 4/1997 | Berkley | 378/72 |
| 6,415,486 B1 | * | 7/2002 | Prevey, III | 29/90.01 |
| 6,622,570 B1 | * | 9/2003 | Prevey, III | 73/826 |
| 6,711,928 B1 | * | 3/2004 | Easterbrook | 72/334 |
| 6,813,749 B2 | * | 11/2004 | Rassaian | 716/4 |

OTHER PUBLICATIONS

Introduction of Residual Stresses to Enhance Fatigue Performance in the Initial Design, by Paul Prevey, Nayaraman Jayaraman and Ravi Ravindranath, Jun. 14-17, 2004, presented for Turbo Expo 2004.
Mean Stress Effects on The High Cycle Fatigue Limit Stress in Ti-6Al-4v, by Theodore Nicholas and David C. Maxwell.
Fundamentals of Metal Fatigue Analysis, by . J Bannatine, Jess L. Coner and J. L. Handock, Pretice-Hall Inc., 1990, pp. 34 and 35.
Metal Fatigue in Engineering, by H.O. Fuchs and R.IL Stephens, John Wiley & Sons, New York, 1980 pp. 150-155.

\* cited by examiner

*Primary Examiner*—Albert W. Paladini
(74) *Attorney, Agent, or Firm*—Mark F. Smith; Smith Brandenbure Ltd; Brian A. Tent

(57) ABSTRACT

A method and system for designing a part with improved fatigue life and resistance to stress corrosion cracking in which residual stresses existing in the part are accounted for. The performance criteria and operating conditions of the part are assessed and a total stress state is determined from the sum of the residual stresses and applied stresses acting on the part. Unified Fatigue Performance Model or Smith-Topper-Neuber parameters are used to determine fatigue life functions which, in turn, are used in conjunction with a fatigue design diagram to determine the appropriate residual stress to introduce in order to optimize the part's resistance to stress induced failure mechanisms. A residual stress distribution is then designed to avoid distortion of the part while still imparting the beneficial effects of compressive residual stress.

20 Claims, 7 Drawing Sheets

FIG 2: Phase I Feasibility & Demonstration

FIG 3: Phase II Process Implementation

METHOD AND SYSTEM FOR IMPROVING A PART'S RESISTANCE TO STRESS INDUCED FAILURE

BACKGROUND OF THE INVENTION

This invention relates to the design and manufacture of metallic parts and, more specifically, to a method and a system for improving a part's resistance to stress induced failure.

The combined stress state of a part is defined as the sum total of the applied stresses acting on the part during operation as well as any existing residual stresses. Existing residual stresses are those stresses imparted to the part during manufacturing operations such as casting, forming, welding, heat treatment, machining, etc. The residual stresses in the part may be of such magnitude that, when added to the applied stresses, the part may fail prematurely. A variety of treatments are known to reduce susceptibility to stress induced failure mechanisms. Most of these treatments are employed to mitigate the impact of existing tensile residual stresses in the part by either reducing existing residual tension, such as by heating, or inducing compression in the part. Such compressive stresses are known to influence fatigue and stress corrosion cracking failure by acting in concert with, and in addition to, any applied stress encountered while the part is in service. Common methods of inducing compression in a part include various shot peening techniques, laser shocking or laser shock peening, as well as deep rolling and burnishing. Such methods are typically performed either during or after production of the part.

It is well known that inducing compressive residual stresses in the surface of a part can improve the performance and service life of the part. However, traditional design techniques do not take into account the residual stresses developed in a part during manufacturing. Instead, existing design techniques generally assume that a part will be stress free upon completion. Accordingly, part designs rarely include any consideration of the effect residual stresses will have on the susceptibility of the finished part with regard to stress induced failure. If it is subsequently determined that tensile residual stresses exist in the part and that these residual stresses will have a significant detrimental impact on fatigue life or stress corrosion cracking, one of the aforementioned methods of inducing compression in the part may be performed as a remedial measure. In this way, the effects of tensile residual stresses within the part are reduced or eliminated and the resistance of the part to stress induced failure is improved. Unfortunately, the implementation of such remedial treatments may result in other difficulties.

When compression is induced in a part to alleviate tensile residual stresses it is necessarily accompanied by an equilibrating amount of tension such that the net forces within the volume of the part sum to zero. This equilibrating tension is sometimes problematic. Parts that are designed with extremely close tolerances may not have enough material to accommodate the magnitude of the equilibrating tension associated with the introduction of compression. This can result in failure in the region where the equilibrating tension develops. Further, the compressive residual stresses introduced in the part may buckle or distort the part's dimensions beyond the desired tolerances thereby destroying the viability of the part. In order to counteract this effect, traditional design techniques often call for an excess of material to be added to the part. This addition of extra material operates to reduce the magnitude of equilibrating tension and the distortion that may occur by the introduction of compressive stresses. However, the inclusion of extra part material may add significant weight as well as cost to the finished part. Furthermore, a part containing excess material will typically not be optimized for the given application if component weight or size is a critical concern.

In its conventional form, Haigh Diagrams have been used to demonstrate the interaction between applied mean stress and applied alternating stress, the combination of which effects the fatigue life of a part. Such diagrams have also been used as a means to predict the service life of a part subject to such stresses. Haigh Diagrams are most often used in conjunction with fatigue life prediction functions such as those developed by Soderberg, Goodman, Gerber and Morrow. Such functions describe the fatigue life that can be achieved for a given combination of alternating and mean stresses.

A typical Haigh Diagram, also referred to as a "Goodman" diagram, is commonly used to evaluate the effect of combined stresses in the region where the mean stress is tensile ($S_{mean}>0$). In limited circumstances, a Haigh Diagram will be developed that will incorporate both tensile and compressive residual stresses in an effort to demonstrate their effect in the combined stress state. For example one such circumstance is disclosed on pages 150 to 154 of "Metal Fatigue in Engineering" by H. O. Fuchs and R. I. Stephens (Copyright 1980 John Wiley & Sons). In this example the compressive quadrant of the Haigh Diagram is shown in conjunction with the Smith-Watson-Topper fatigue life function. However, a method of using the diagram to optimize the fatigue performance of a particular component under given operational conditions is not disclosed. Despite the sporadic inclusion of compressive residual stresses, the exact effect of compressive stresses has not, until now, been shown or taught with respect to the Haigh Diagram.

Consequently, a need exists for a relatively inexpensive method and system for analyzing the impact of tensile residual stresses developed during the manufacturing process of a part and for determining the desired compressive residual stress distributions to be induced in the part to improve the resistance of the part to stress induced failure mechanisms, improve part performance and to effect a significant weight savings.

SUMMARY OF THE INVENTION

The present invention is a new and improved method and system for improving a part's resistance to stress induced failure by optimizing the residual stresses in a part, preferably as a parameter in the design of a part. In a preferred embodiment of the invention, the method comprises the steps of determining the total stress state of the part; designing a residual stress distribution to be introduced in the part to offset the effects of the total applied and residual stress distributions; and inducing the designed residual stress distribution in the part. In another preferred embodiment of the subject application, the method further includes the step of calculating the necessary stress distribution and pattern to be induced in the part such that it will meet certain performance criteria; determining the appropriate processing steps and parameters to induce the desired residual stress distribution in the part; and inducing the desired compressive residual stress distribution in the part using such processing steps and parameters.

Preferably, the total stress state of the part is calculated by determining all of the existing residual stresses and the anticipated applied stresses that would be incident on the part while it is in actual operation. The existing residual stresses of the part may be determined either through direct measurement or by analytical means. Anticipated applied stresses may be determined through finite element analysis, direct measurement, or a combination of both. The total stress state of the part during operation can then be determined by adding the existing residual stresses to the applied stresses.

In another embodiment of the invention, the amount of residual stresses that can be introduced in the material forming the part is analyzed empirically by determining the residual stress distribution that may be imparted to the material from which the part is made by subjecting the material to processes including, but not limited to, low plasticity burnishing, deep rolling, shot peening, laser shocking, heat treatment, or other residual stress altering means, and then measuring the stress distribution induced in the material as a result of such operations.

In another embodiment of the invention, the desired amount and distribution of residual stress to be induced into the part is calculated based on fatigue failure, stress corrosion cracking, and/or service life criteria. More particularly, the compressive residual stresses that are to be induced into a part are calculated using fatigue failure, stress corrosion cracking, or service life criteria, linear elastic fracture mechanics, other fatigue life prediction means, empirically determined effective initial flaw size characteristics of the final surface treatment, or any combination of the aforementioned techniques.

In another embodiment of the invention, the magnitude and distribution of the residual stress is optimized for the specific application in which the part will be employed. Preferably, the amount and distribution of residual stresses to be induced into a part in order to counteract the effects of the applied and residual stresses acting on the part is calculated utilizing a uniquely modified Haigh Diagram in conjunction with the Unified Fatigue Performance Model such that the desired residual stresses induced in the part are compressive stresses.

In another embodiment of the invention, the magnitude and distribution of the residual stress is optimized for a specific high cycle fatigue or low cycle fatigue application in which the part will be employed. Preferably, the amount and distribution of residual stresses to be induced into a part in order to counteract the effects of the applied and residual stresses acting on the part is calculated utilizing a uniquely modified Haigh Diagram in conjunction with the Smith-Topper-Neuber fatigue life parameters such that the desired residual stresses induced in the part are compressive stresses.

In another embodiment of the invention, a part having damage, such as a fielded part, is examined and the extent of damage in a fielded part is determined and the magnitude and distribution of induced residual stress is optimized such that the service life of the fielded part is maximized without risk of failure due to existing damage. Preferably, the size and location of damage, such as micro-cracks and foreign object damage (FOD), are determined through inspection using eddie currents, ultrasonic, x-ray, meandering wavelength magnetometer or other crack detection means. The amount and distribution of residual stresses to be induced into the part in order to counteract the effects of the damage and thereby extend or reclaim the fatigue life lost due to the damage are then calculated.

In another embodiment of the invention, the method and system of the current application are used to select and optimize materials for specific applications. Preferably, the operating conditions, including applied stress and desired fatigue life, are used in conjunction with a modified Haigh Diagram and the Unified Fatigue Performance Model, Smith-Topper-Neuber parameters, or fatigue life functions to determine an alloy appropriate for the given application.

In another embodiment of the invention, the magnitude and distribution of the residual stresses are measured after being induced in the part. Preferably, the magnitude and distribution of the residual stresses induced in the part are verified through direct measurement and, if necessary, iterating the methodology of the present application to optimize the magnitude and distribution of the desired residual stress.

In another embodiment of the invention, the impact of the induced desired residual stress on stress induced failure mechanisms is assessed. Preferably, fatigue and/or stress corrosion cracking performance of the residual stresses is assessed by testing either the actual part or feature specimens containing the same level of applied stress, geometry and finish, iterating the methodology of the present application based on the test results, and repeating the process and testing as needed until the desired level of part performance is reached.

The system of the present invention comprises the method for determining the total stress state of the part and means for determining a residual stress distribution that is effective for offsetting the effects of the total applied and residual stress distributions. In another preferred embodiment of the invention, the system further includes means for inducing the designed residual stress distribution in the part.

In another preferred embodiment of the subject application, the system includes means for calculating the necessary stress distribution and pattern to be induced in the part such that it will meet certain performance criteria.

In another preferred embodiment of the subject application, the system includes means for determining the appropriate processing steps and parameters to induce the desired residual stress distribution in the part. In another preferred embodiment of the invention, the system includes means for inducing the desired compressive residual stress distribution in the part using such processing steps and parameters.

In another preferred embodiment of the invention, the means for inducing the desired compressive residual stress distribution in the part comprises a burnishing means.

It will be understood that the method and system of the present application can be utilized for a variety of purposes relating to the mitigation of stress induced failure mechanisms in both new and fielded parts. Such purposes include, but are not limited to, the improvement of part designs limited by fatigue and stress corrosion cracking, the prediction of the fatigue life of a part at a given stress, the calculation of the maximum stress a part may withstand without failure, the estimation of the remaining service life of a part under specific operational conditions, the selection of materials based on stress and life performance criteria, and the calculation of the amount of compressive residual stresses that should be induced in fielded parts in order to reclaim all or a significant portion of their fatigue life. The method and system of the present invention can also be used to improve the fatigue life and/or resistance to stress corrosion cracking in parts used in a wide variety of applications, including, but not limited to, aircraft and ground-based turbines, aircraft structural components, metallic weldments, piping and components used in nuclear, fossil fuel, steam, and gas plants, distribution piping for gases and fluids, automotive components such as gears, springs, shafts, connecting rods, bearings and any other part susceptible to fatigue and/or stress corrosion failure as well as a plethora of other applications too numerous to be mentioned herein.

Other embodiments and advantages of the invention will be apparent from the following description, the accompanying, drawings, and the appended claims.

BRIEF DESCRIPTION OF THE DRAWINGS

To provide a more complete understanding of the present invention and further features and advantages thereof, reference is now made to the following description taken in conjunction with the accompanying drawings, in which.

DETAILED DESCRIPTION OF THE INVENTION

Figure 1:
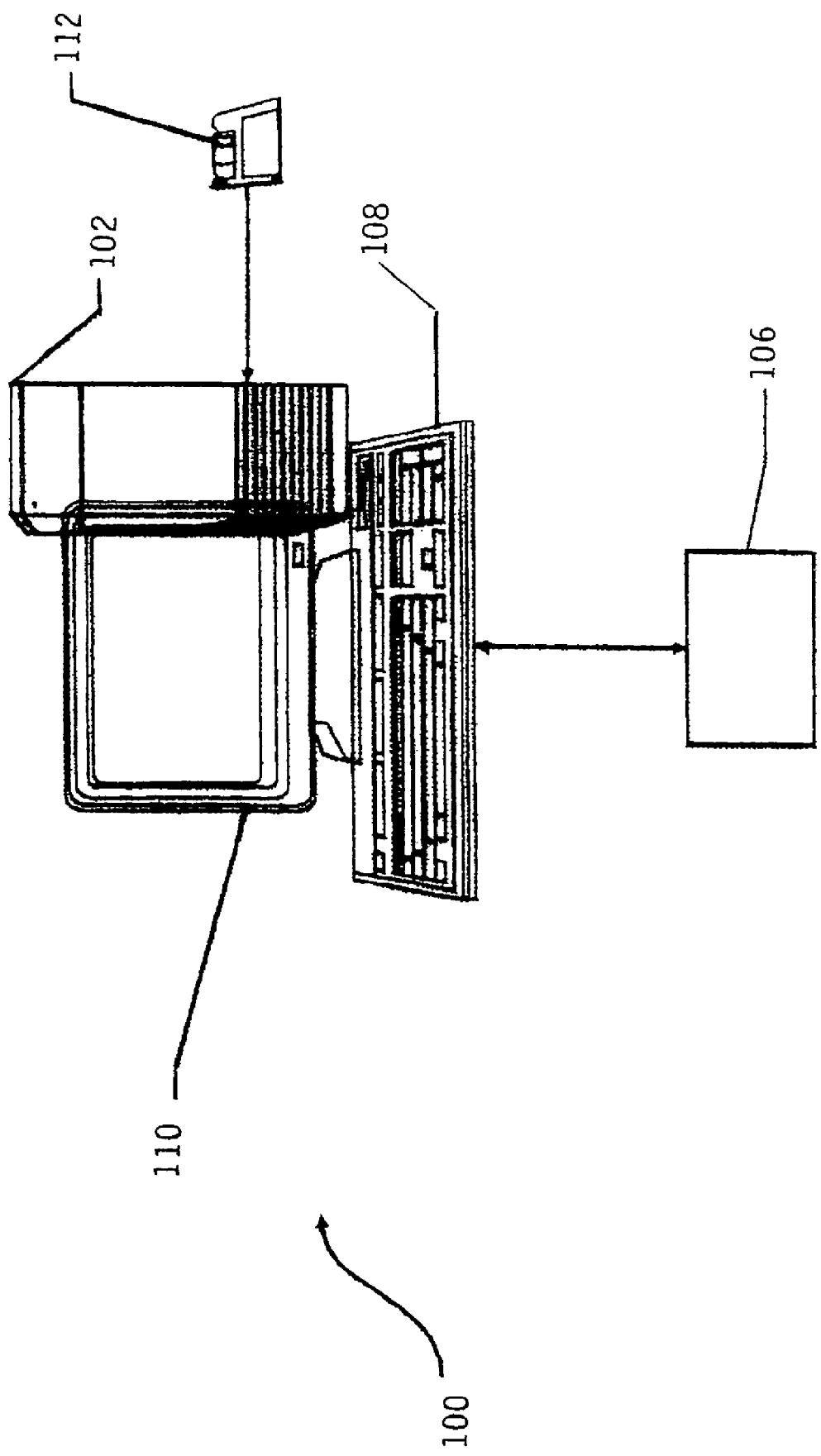
FIG. 1 is a schematic diagram of a computer system used to implement the system software for performing the method of improving a part's resistance to stress induced failure.

The present invention is a method and system for improving a part's resistance to stress induced failure by optimizing the residual stresses in a part, preferably as a parameter in the design of a part. In describing the preferred embodiments of the invention illustrated in the drawings, specific terminology will be resorted to for the sake of clarity. However, the invention is not intended to be limited to the specific terms so selected, and it is to be understood that each specific term includes all technical equivalents that operate in a similar manner to accomplish a similar purpose.

Referring to FIG. 1, a preferred embodiment of the system for improving a part's resistance to stress induced failure utilizes a computer system 100 used to implement the system software 200 (FIG. 2) for performing the method of improving a part's resistance to stress induced failure. The computer system 100 comprises a processor and a memory 102 that may be coupled to other devices, such as a suitable input device 108, like a keypad, touch screen, or any other suitable input device that can accept information, and one or more suitable output devices 110, such as a computer display, printer, projection device, and the like. It should be understood that the computer system 100 can include any combination of the above components, or any number of different components, peripherals, and other devices. Preferably, the computer system 100 operates under the control of an operating system, such as the WINDOWS™ operating system developed by Microsoft Corporation or the Macintosh™ operating system developed by Apple Computer Corporation. It should be understood, however, that other operating systems could be utilized to implement the system software 200 (FIG. 2) for performing the method for improving a part's resistance to stress induced failure of the present invention.

The system software 200 is a computer-readable medium having computer-readable instructions for performing the method for improving a part's resistance to stress induced failure. Preferably, the system software 200 is an interactive, menu and event driven system that uses prompt, dialog, and entry windows to guide a user to enter information. As used herein, the term "software" refers to any form of programmed machine-readable language or instructions (e.g., object code) that, when loaded or otherwise installed, provides operating instructions to a machine capable of reading those instructions, such as a computer. The system software 200 of the present invention can be stored or reside on, as well as be loaded or installed from, one or more floppy disks, CD ROM disks, hard disks or any other form of suitable non-volatile electronic storage media 112. The system software 200 can also be installed by downloading or other form of remote transmission, such as by using Local or Wide Area Network (LAN or WAN)-based, Internet-based, web-based or other remote downloading or transmission methods 116.

Figure 2:
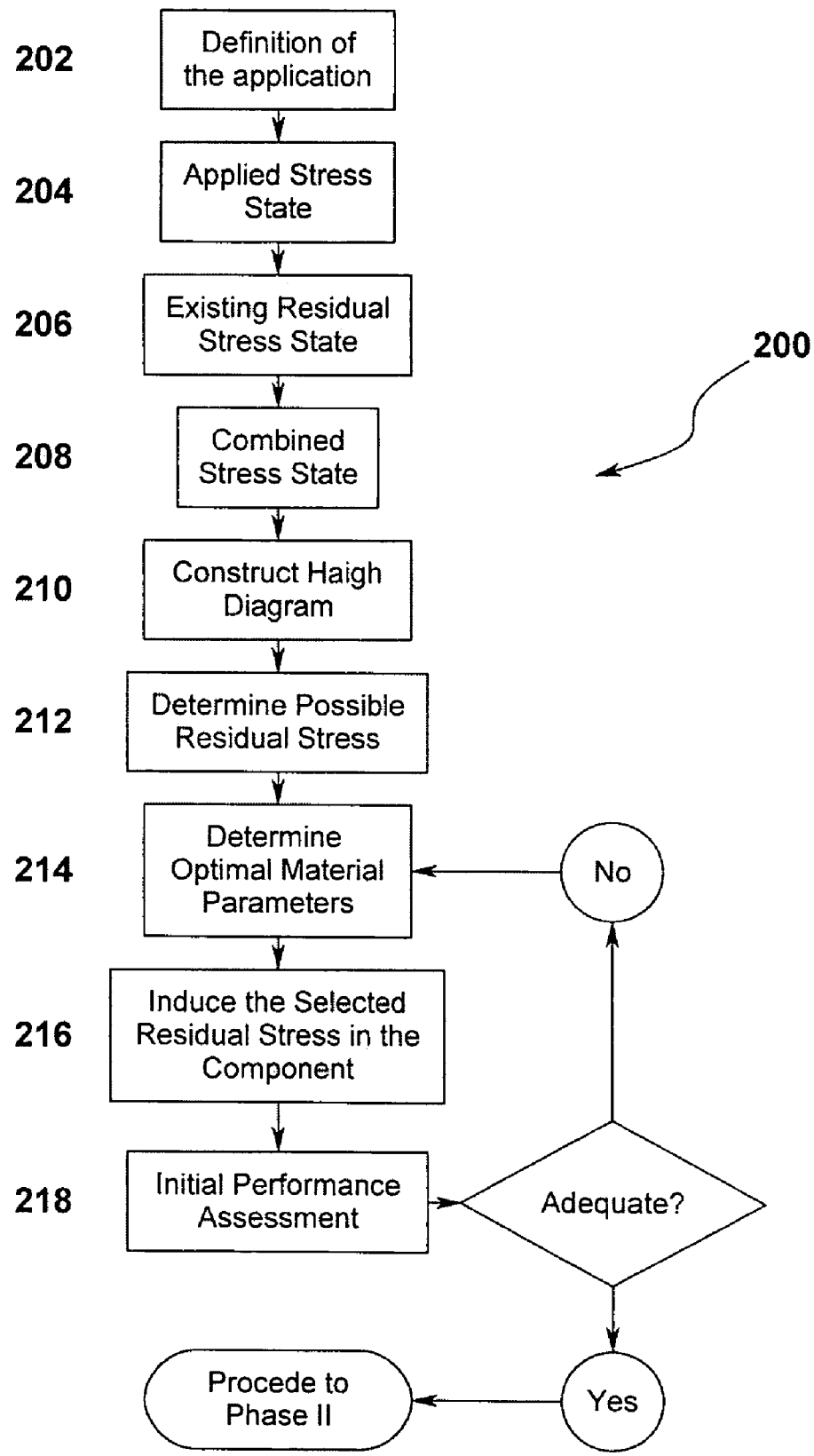
FIG. 2 contains a flow diagram of Phase I of the system software for performing the method of improving a part's resistance to stress induced failure.
Figure 3:
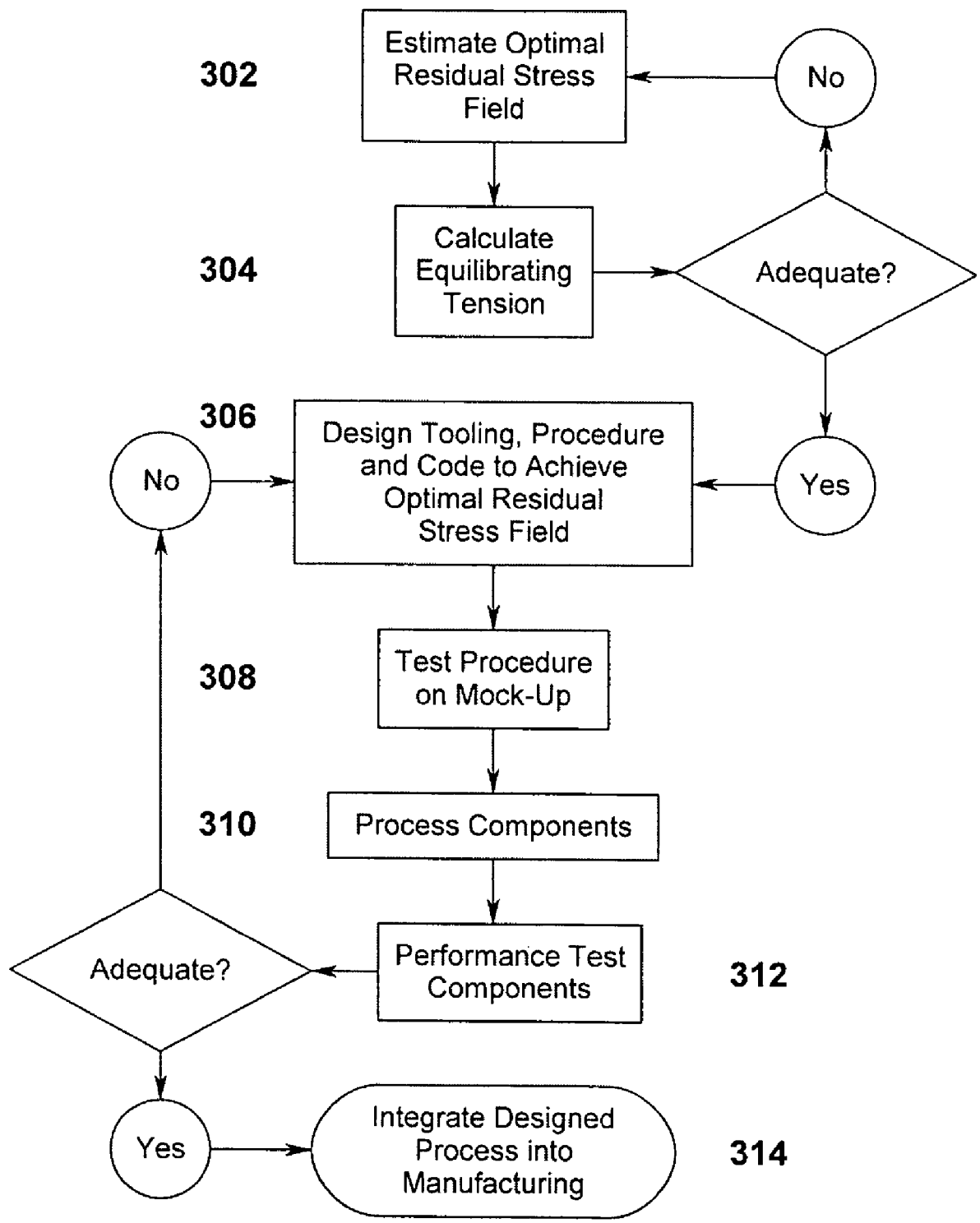
FIG. 3 contains a flow diagram of Phase II of the system software for performing the method of improving a part's resistance to stress induced failure.
Figure 4:
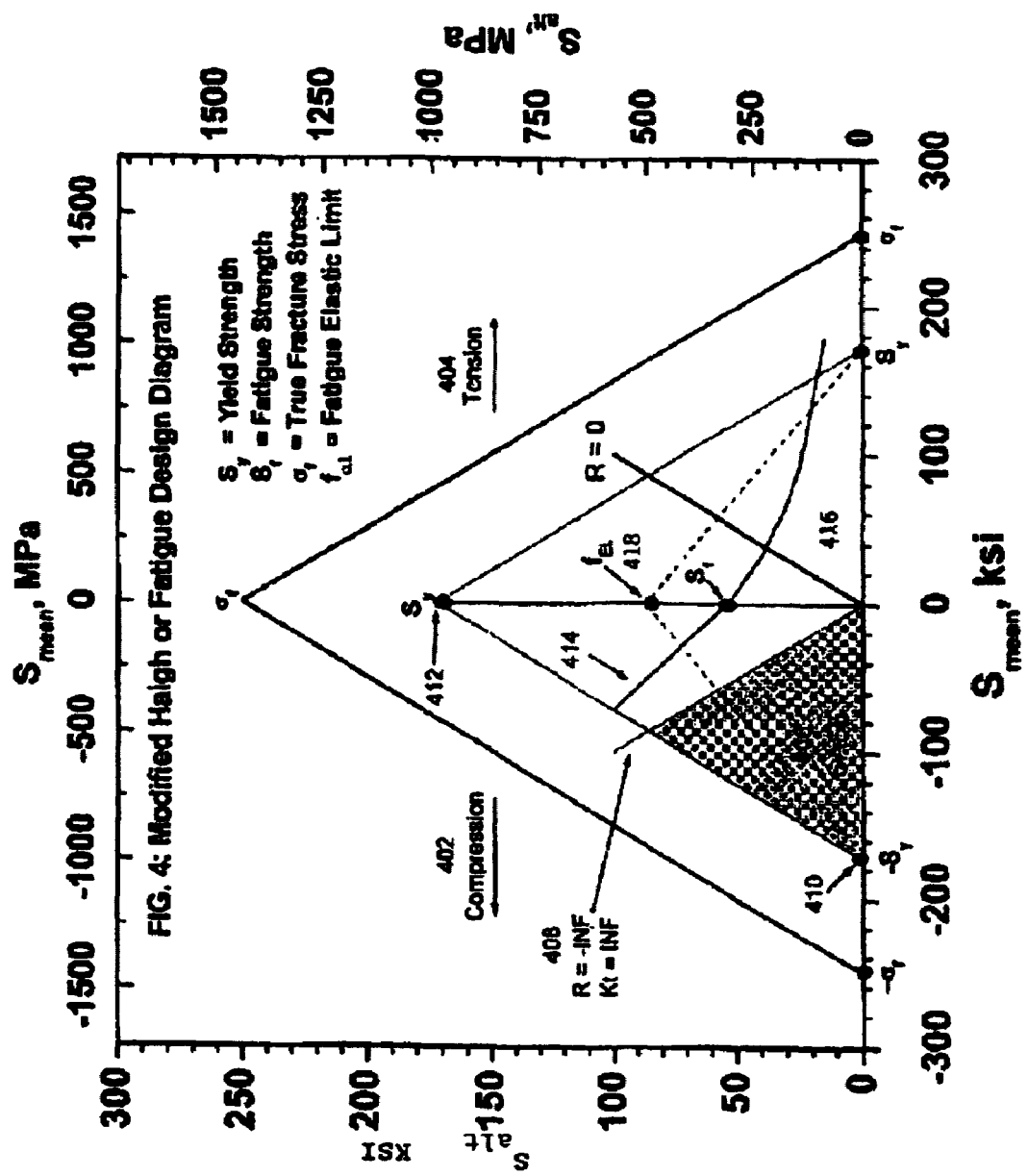
FIG. 4 shows a Fatigue Design Diagram, which is a subject of the current invention, as well as a Smith-Topper-Neuber life prediction function, verified by the Unified Fatigue Performance Model, for a particular value of the stress concentration factor, $K_t$.

Referring to FIGS. 2 and 3, a flowchart illustrating the structured methodology and design of the system software 200 of the present invention is illustrated. In addition to teaching the incorporation of residual stresses as a parameter in the initial design of a part, the method of the present invention also uses a modified Haigh Diagram, as shown in FIG. 4, in conjunction with a Unified Fatigue Performance Model and/or a combination of Smith-Topper-Neuber fatigue life parameters in order to optimize the design of the residual stress field that is to be induced into the part. Accordingly, the subject invention is a new and novel method and system for improving a part's resistance to stress induced failure and creates and utilizes a modified Haigh Diagram for an evaluation of the impact of compressive residual stresses in combination with stress concentration factors, $K_t$, on fatigue life.

The modified Haigh Diagram of the present application, hereinafter referred to as a Fatigue Design Diagram, is illustrated in FIG. 4 and deviates from the traditional Haigh Diagram in several ways. In accordance with the method of this invention, the Fatigue Design Diagram includes quadrants representing regions having compressive 402 and tensile 404 mean stresses as well as several newly defined sub-regions 406, 416 that are used to optimize the fatigue performance of a given material system. The safe region 406, located in the compression quadrant, is bounded by the line R=–∞ 408 (which is the same as $K_t=\infty$) and the line connecting the negative yield strength $(-S_y)$ 410 and the cyclic yield strength $(S_y)$ 412. R is defined as a ratio of the minimum alternating stress to the maximum alternating stress $(R=S_{min}/S_{max})$ while $K_t$ is a stress concentration factor relating to a notch or other geometric feature, as discussed below. The X-axis forms the lower boundary of the safe region 406 and is indicative of zero alternating stress. For applications susceptible to high cycle fatigue failures, combinations of alternating stress and mean stress that fall within this safe region 406 have enhanced performance with respect to fatigue failure in that failure should not occur by conventional fatigue crack propagation. Stress combinations falling within this safe region 406 for a given material system should not or are not expected to fail as a result of fatigue.

The fatigue elastic limit sub-region 416, or FEL region, partially overlaps the safe region and has an upper boundary formed by the lines connecting the negative yield strength ($-S_y$) 410, the fatigue elastic limit ($f_{E.L.}$) 418 and the yield strength ($S_y$) 420. The fatigue elastic limit 418 denotes the alternating stress level at which fatigue behavior transitions from purely elastic behavior to a combination of plastic and elastic behavior. As with the safe region 406, the X-axis forms the lower boundary of the FEL region 416. The area of the fatigue design diagram falling within the FEL region describes possible combinations of alternating and mean stress that can be used to optimize the fatigue performance of components susceptible to low cycle fatigue failure.

The FEL and Safe sub-regions of the Fatigue Design Diagram can be used in conjunction with fatigue life functions which predict the fatigue life of a component based on the operating conditions and material characteristics. These functions, in conjunction with the Fatigue Design Diagram, can be used to enhance and optimize the fatigue performance of a component. Fatigue life functions that may be used in conjunction with the Fatigue Design Diagram may be selected from the list including, but not limited to, Smith-Watson-Topper (SWT), Walker, and Jasper fatigue life functions as well as the Unified Fatigue Performance Model, which is a subject of the current invention and discussed below.

The Fatigue Design Diagram of the current application may also be utilized in conjunction with the newly established Unified Fatigue Performance Model that is also a subject of the current invention. The Unified Fatigue Performance Model of the current invention, like previous fatigue life functions such as Walker, Jasper and SWT, has been developed to predict the fatigue life of a particular component based on the fatigue properties of the material from which it is manufactured. However, unlike earlier fatigue life functions, the Unified Fatigue Performance Model has been developed to include fatigue life prediction capabilities for both high cycle and low cycle fatigue applications. The output of this model is a series of fatigue life functions for the specified material system that describe the fatigue behavior of the material for a range of notch sensitivities or stress concentration factors, $K_t$, at a specified endurance limit, either high or low. These fatigue life functions 414 can then be plotted on the Fatigue Design Diagram and thereafter used to optimize the high and low cycle fatigue performance of a given material system.

The Unified Fatigue Performance Model of the subject application operates to show the fatigue life of a part under both high and low cycle conditions. The model, is effective for showing both the elastic and plastic behavior of materials and was created using Hooke's law governing the elasticity of material, the Ramberg-Osgood relationship describing the plastic behavior of material, Neuber's rule relating to stress and strain concentration factors and Basquin, Coffin-Manson, and Smith-Watson-Topper relationships describing high cycle fatigue (HCF) and low cycle fatigue (LCF) behavior. The Unified Fatigue Performance Model is formed from these relationships by performing the following steps:

Utilizing Hooke's law, $$\epsilon_{elastic} = \sigma/E \tag{1},$$

which describes the elastic strain behavior of a material at a given stress and using the Ramberg-Osgood relationship, $$\epsilon_{plastic} = (\sigma/K)^{1/n} \tag{2},$$

which describes the plastic behavior of a material at a given stress, the two can be combined to generate a combined elastic-plastic stress-strain relationship such that:

$$\epsilon_{total} = \epsilon_{elastic} + \epsilon_{plastic} = \sigma/E + (\sigma/K)^{1/n} \tag{3}.$$

Where the material is notched, the effect of stress and strain on the notch can be described by stress concentration factors $$k_\sigma = \sigma/S \tag{4.1}$$

and $$k_\epsilon = \epsilon/e \tag{4.2}$$

where S and e represent the far-field stress and strain, and $\sigma$ and $\epsilon$ represent the stress and strain at the notch root. The total stress concentration factor $k_t$ is then determined by combining equations 4.1 and 4.2 such that $$k_t = \sqrt{k_\sigma k_\epsilon} = \sqrt{\{(\sigma/S)(\epsilon/e)\}} = \sqrt{(\sigma\epsilon/Se)} \tag{5}.$$

Rearranging equation 5 and substituting for e by (S/E), yields $$\sigma\epsilon = k_t^2 Se = (k_t S)^2/E \tag{6},$$

which can be further rearranged such that $$(k_t S)^2 = \sigma\epsilon E \tag{7}.$$

Substituting equation 3 into equation 7 produces $$(k_t S)^2 = \sigma E(\epsilon_{elastic} + \epsilon_{plastic}) \tag{8}.$$

Further substitution results in the Neuber relationship for elastic-plastic loading conditions defined as $$(k_t S)^2 = \sigma E\{\sigma/E + (\sigma/K)^{1/n}\} = \sigma^2 + \sigma E(\sigma/K)^{1/n} \tag{9}.$$

Turning to the Basquin and Coffin-Manson relationships for high and low cycle fatigue where $R=-1$ the equations for elastic and plastic strain take the form $$(\Delta\epsilon_{elastic}/2)_{R=-1} = S_{alt}/E = (\sigma_f'/E)(2N_f)^b \tag{10}$$

and $$(\Delta\epsilon_{plastic}/2)_{R=-1} = \epsilon_{alt} = \epsilon_f'(2N_f)^c \tag{11}.$$

These equations can then be combined to show the Strain-Life relationship under combined HCF/LCF conditions such that $$(\Delta\epsilon_{total}/2)_{R=-1} = (\Delta\epsilon_{elastic}/2) + (\Delta\epsilon_{plastic}/2) = \{(\sigma_f'/E)(2N_f)^b + \epsilon_f'(2N_f)^c\} \tag{12}$$

where $\sigma_f'$, $\epsilon_f'$, b and c are material constants, and $b=-n/(1+5n)$, $c=-1/(1+5n)$.

Turning now to the Smith Watson Topper Relationship describing fatigue performance for all R-ratios with a $k_t$ of 1

$$\sqrt{\{S_{max}\epsilon_{alt}E\}} = Z \tag{13}$$

where Z is a constant. Since $S_{max} = S_{mean} + S_{alt}$, equation 14 can be re written as $$\sqrt{\{(S_{mean} + S_{alt})\epsilon_{alt}E\}} = Z \tag{14}.$$

As described above, stress and strain conditions in the root area of a notch are defined by equations 4 and 5. Equation 14 can therefore be rewritten $$\sqrt{\{k_o(S_{mean}+S_{alt})k_\epsilon \epsilon_{alt}E\}} = Z \qquad (15)$$

Returning to equation 5, the notch sensitivity factor is defined as $k_t = \sqrt{(k_o k_\epsilon)}$. Substituting this into equation 15 results in $$k_t\sqrt{\{(S_{mean}+S_{alt})\epsilon_{alt}E\}} = Z \qquad (16)$$

where the constant Z is determined from known material constants for pure HCF and combined LCF/HCF conditions. Equation 16 is commonly referred to as the Smith-Watson-Topper relationship and can be used, as discussed above, in conjunction with the Fatigue Design Diagram to predict the fatigue life of component.

In applying the Smith-Watson-Topper conditions to High Cycle Fatigue, elasticity conditions where $\epsilon_{alt}E = S_{alt}$ dominate the process such that equation 16 takes the form $$k_t\sqrt{\{(S_{mean}+S_{alt})S_{alt}\}} = Z \qquad (17)$$

When $k_t=1$ and $R=-1$ (i.e., $S_{mean}=0$), and $S_{alt}=S_e$, then $Z=S_e$, where $S_e$ is the smooth bar fatigue strength at the chosen endurance limit (for example, $10^7$ cycles). Therefore, equation 17 can be written $$k_t\sqrt{\{(S_{mean}+S_{alt})S_{alt}\}} = S_e \qquad (18)$$

Solving for $S_{mean}$ equation 18 can be rewritten $$S_{mean} = \sqrt{\{(S_e/k_t)^2/(S_{alt})\}} - S_{alt} \qquad (19)$$

Where $S_e$ is a material constant. Equation 19 is hereinafter referred to as the modified SWT equation as applied to high cycle fatigue.

Turning now to combined high cycle and low cycle fatigue, the Smith-Watson-Topper relationship represented in equation 16 can be used to encompass the combination of both fatigue states. As described above, in order to determine the constant Z for combined HCF/LCF conditions, the values $k_t=1$ and $R=-1$ (i.e., $S_{mean}=0$) are substituted into equation 16 which yields $$\sqrt{\{S_{alt}\epsilon_{alt}E\}} = Z \qquad (20)$$

From equations 10, 11 and 12

$$S_{alt} = E(\Delta\epsilon_{elastic}/2) = E(\sigma_f'/E)(2N_f)^b = (\sigma_f')(2N_f)^b \qquad (21)$$

and $$\epsilon_{alt} = (\Delta\epsilon_{total}/2) = (\sigma_f'/E)(2N_f)^b + \epsilon_f'(2N_f)^c \qquad (22)$$

Substituting 21 and 22 into 20 and solving results in $$Z = \sqrt{[\{(\sigma_f')(2N_f)^b\}\{(\sigma_f'/E)(2N_f)^b + \epsilon_f'(2N_f)^c\}]} \qquad (23)$$

Substituting for Z from equation 23 into equation 16 yields $$k_t\sqrt{\{(S_{mean}+S_{alt})\epsilon_{alt}\}} = \sqrt{[\{(\sigma_f')(2N_f)^b\}\{(\sigma_f'/E)(2N_f)^b + \epsilon_f'(2N_f)^c\}]} \qquad (24)$$

Because $\epsilon_{alt} = \Delta\epsilon_{total}/2 = (\Delta\epsilon_{elastic}/2) + (\Delta\epsilon_{plastic}/2) = (\epsilon_{alt})_{elastic} + (\epsilon_{alt})_{plastic}$ and $(\epsilon_{alt})_{elastic} = S_{alt}/E$, $(\epsilon_{alt})_{plastic} = (S_{alt}/K)^{1/n}$, equation 25 can be rewritten as $$k_t\sqrt{[(S_{mean}+S_{alt})\{S_{alt}/E+(S_{alt}/K)^{1/n}\}]} = \sqrt{[\{(\sigma_f')(2N_f)^b\}\{(\sigma_f'/E)(2N_f)^b + \epsilon_f'(2N_f)^c\}]} \qquad (25)$$

Solving equation 25 for $S_{mean}$, one can then create a Unified Fatigue Performance Model which can be used to show the fatigue behavior of materials under both high cycle and low cycle fatigue conditions. The Unified Fatigue Performance Model operates by using the equation:

$$S_{mean} = [\{(\sigma_f')(2N_f)^b\}\{(\sigma_f'/E)(2N_f)^b + \epsilon_f'(2N_f)^c\}/(k_t^2\{S_{alt}/E+(S_{alt}/K)^{1/n}\})] - S_{alt} \qquad (26)$$

where $\sigma_f'$, $\epsilon_f'$, b, c, E, K and n are material constants.

In addition, the model also utilizes a unique combination of Smith-Topper and Neuber fatigue parameters for use in optimizing fatigue performance in applications susceptible to high cycle fatigue failure. It has been empirically determined that the combination Smith-Topper and Neuber parameters, hereinafter Smith-Topper-Neuber parameters, can be used to show the effect of introducing a stress concentration factor, $K_t$, into the existing fatigue prediction model. It has further been determined that, in the case of high cycle fatigue, fatigue life functions empirically derived from Smith-Topper-Neuber parameters are interchangeable with the fatigue life functions developed using the created Unified Fatigue Performance Model.

The interchangeability of Smith-Topper-Neuber parameters and the Unified Fatigue Performance Model for high cycle fatigue applications is best illustrated using the Unified Fatigue Performance Model. As stated above, the modified Smith-Watson-Topper relationship shown in equation 19 represents a specific, high cycle fatigue limited case of the general solution for the Unified Fatigue Performance Model. Equation 19 is also analogous to the empirical solution of the Smith-Topper-Neuber parameters for fatigue life predictions. A comparison of the Smith-Topper-Neuber solution and the high cycle fatigue case-limited solution of the Unified Fatigue Performance Model establishes greater than 98% agreement between the two approaches when applied to high cycle fatigue life predictions for the Ti-6Al-4V alloy system.

Figure 5:
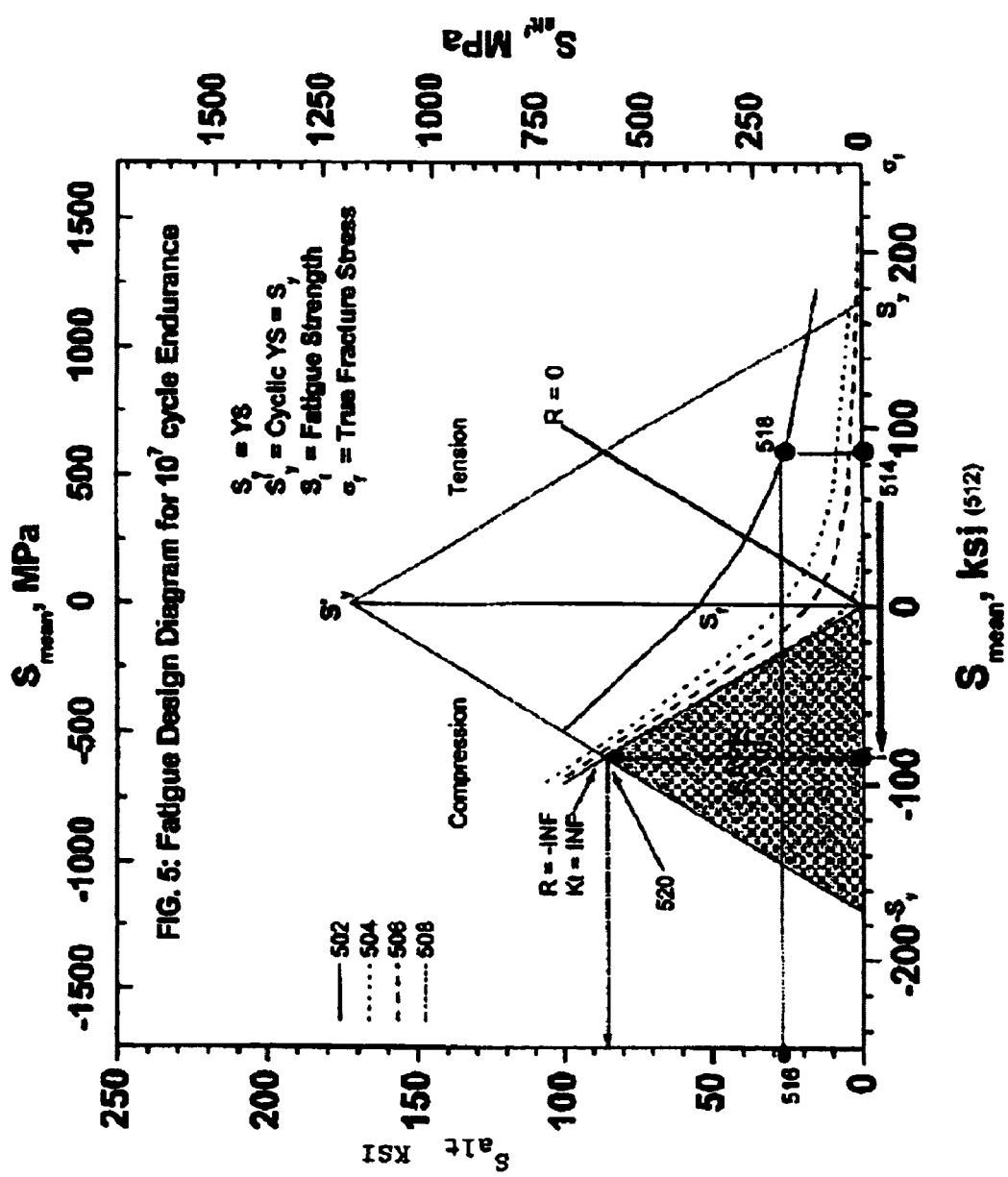
FIG. 5 shows a Fatigue Design Diagram illustrating the method of the present invention as applied to a high cycle fatigue application.

The fatigue life functions generated by both the Unified Fatigue Performance Model and Smith-Topper-Neuber parameters provide a line of constant part life for a given value of $K_t$. This means that combinations of alternating stress and mean stress falling on or below the fatigue life function will reach the specified endurance limit without failing while combinations falling above the fatigue life function will fail prior to reaching the specified endurance limit. Referring now to FIG. 5, fatigue life functions 502–508 are plotted on the Fatigue Design Diagram for a range of sensitivity factors as shown in the figure. Specifically referring to FIG. 5, the fatigue life functions 502–508 plotted therein were derived from Smith-Topper-Neuber parameters. These fatigue life functions 502 508, like the Walker, Jasper, SWT and Unified Fatigue Performance Model fatigue life functions, can be used to optimize fatigue performance by predicting the appropriate compressive residual stresses that must be introduced in a part such that the alternating stress can be maximized while the risk of incurring failure due to stress induced mechanisms before reaching the specified endurance limit is minimized.

The fatigue life functions are utilized to optimize fatigue performance in the following manner. As shown, several fatigue life functions 502–508 are plotted on the Fatigue Design Diagram for a range of stress concentration factors, $K_t$, and an endurance limit of $10^7$ cycles, which is commonly understood to be infinite life for fatigue design purposes. Specifically referring to the $K_t=1$ Line 502, any combination of alternating stress and mean stress falling on or below this particular fatigue life function 502 will, theoretically, have an infinite service lifetime (at least equal to $10^7$ cycles) for the given operating conditions and $K_t$ value. In contrast, combinations of alternating stress and mean stress falling above this fatigue life function 502 will have a finite life (less than $10^7$ cycles) under the given conditions. A key feature in determining the optimal residual stress field to be induced in the material is the "safe" sub-region 510. Within this sub-region 510, the maximum stress 512, defined as the sum of the applied, residual mean, and alternating stresses, is compressive. Thus, fatigue cracks cannot grow and the material is immune from any notch size and the corresponding stress concentration factor $K_t$. Therefore, if a material has the appropriate compressive residual stress, as defined by this safe region 510, it is possible to increase the applied alternating stress that the material can withstand without failure relative to what the material could otherwise withstand without compression.

To determine what compressive stress must be introduced into the material to optimize the applied alternating stress, it is necessary to evaluate the fatigue life function for a particular value of $K_t$. For example, as illustrated in FIG. 5, for a stress concentration factor of $K_t=1$ 502 and a mean stress 514 of 50 ksi, the applied alternating stress necessary to sustain infinite life should not exceed 35 ksi 516. However if sufficient compressive stress is introduced in the material, thereby shifting the total (residual plus applied) mean stress into the safe region 510, the material will be able to sustain a much higher applied alternating stress and still maintain, at least theoretically, an infinite life. Referring again to FIG. 5, by way of example, suppose the material defined by the fatigue life function with the value $K_t=1$ 502 had a 50 ksi mean stress for a particular R ratio with an alternating stress of 35 ksi 518. If this material is then treated with a process for inducing compressive residual stress such that, after treatment, the mean stress is shifted into the safe region 510, having a value of approximately −85 ksi, the material would then be able to withstand an applied alternating stress of 85 ksi 520, an improvement of over 200%, while still maintaining a theoretically infinite service life. The material in this example would require a treatment capable of inducing −135 ksi of compression in order to reduce the mean stress to −85 ksi and thereby increase the allowed alternating stress to roughly 85 ksi without the risk of failure.

Figure 6:
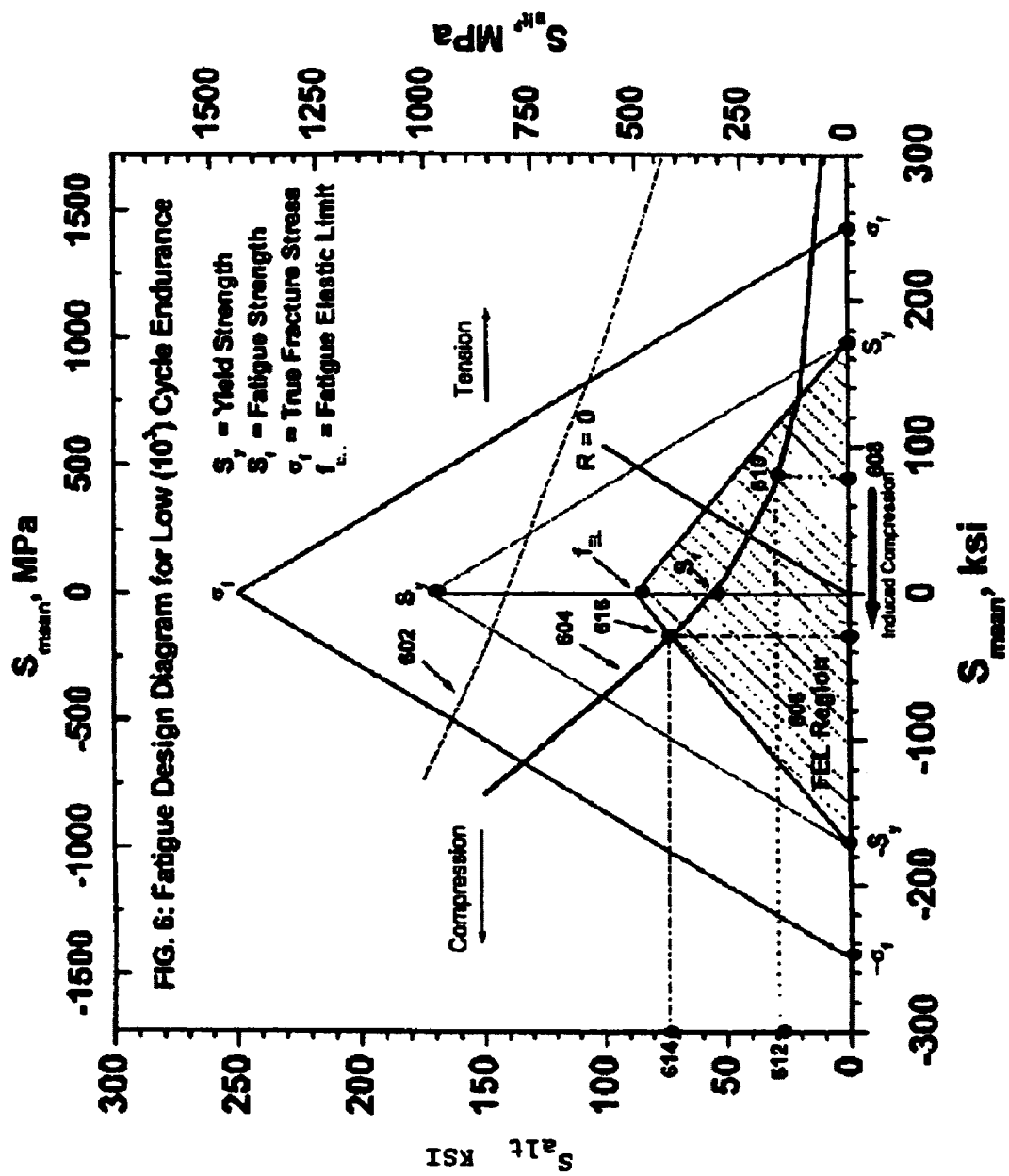
FIG. 6 shows a Fatigue Design Diagram illustrating the method of the present invention as applied to a low cycle fatigue application.

For applications susceptible to failure as a result of low cycle fatigue, the Fatigue Design Diagram can be used in conjunction with the Unified Fatigue Performance Model to optimize the fatigue performance of a given material under specified operating conditions. Referring now to the Fatigue Design Diagram of FIG. 6, the FEL region 606 is of primary importance when optimizing material performance in low cycle fatigue. This is because low cycle fatigue in parts with larger stress concentration factors $K_t$ will generally operate at an alternating stress that is below the elastic limit for the material. Therefore, a materials elastic response to applied stress becomes the dominant behavior in low cycle fatigue. In order to optimize the material for low cycle applications, it is first necessary to use the Unified Fatigue Performance Model to determine fatigue life functions for various stress concentration factors $K_t$. In FIG. 6 fatigue life functions are plotted for values of $K_t=1$ 602 and $K_t=3$ 604 at a specified endurance limit of 1000 cycles. It is important to note that, for fatigue life functions that do not pass through the FEL region 606, such as the fatigue life function for $K_t=1$ 602 in this example, the introduction of compressive residual stresses will have little or no effect and may even have a deleterious effect on fatigue life benefit.

Once the fatigue life functions have been plotted on the Fatigue Design Diagram, it is possible to determine the appropriate parameters for fatigue life optimization. Specifically referring to the fatigue life function for $K_t=1$ 604, any combination of alternating stress and mean stress falling on or below the fatigue life function 604 will, theoretically, reach the endurance limit for which the Fatigue Design Diagram was constructed, in this case, 1000 cycles at a given $K_t$ value and operating conditions. This is similar to, but slightly different than the safe region discussed above for high cycle fatigue. There the endurance limit reached was theoretically infinite which is practically considered to be $10^7$ cycles. For low cycle fatigue applications, the desired endurance limit is somewhat more finite. However, for combinations of alternating stress and mean stress falling above the line 604, the material will prematurely fail before reaching the 1000 cycle endurance limit.

Fatigue performance for low cycle fatigue can be optimized by reducing the mean stress, $S_{mean}$, experienced by the material which, in turn, allows the alternating stress, $S_{alt}$, applied to the material to be maximized without risk of premature failure. This is accomplished through the introduction of compression as illustrated in the following example. As shown in FIG. 6, for a stress concentration factor $K_t=3$ 604 and a mean stress of approximately 85 ksi 610, a part will only reach the specified endurance limit of 1000 cycles if the alternating stress does not exceed 30 ksi 612. However, if sufficient compression is introduced in the material to reduce the mean stress to −25 ksi, the material will be able to withstand an alternating stress of up to 70 ksi, a 130% improvement, while maintaining the ability to reach the desired endurance limit of 1000 cycles. This improvement is obtained by inducing 40 ksi of compression in the material which, in turn, lowers the overall mean stress acting on the material to −25 ksi.

In using the FEL region to optimize low cycle fatigue performance, it is important to note that the maximum obtainable optimization occurs at the point 616 located in the compressive quadrant where the fatigue life function intersects with the boundary of the FEL region 606. Lowering the mean stress beyond this point by inducing further compression substantially increases the risk of compressive failure as the material approaches its negative yield strength, $-S_y$. It is also important to note that, when the fatigue life function is used in concert with the FEL region of the Fatigue Design Diagram, the portion of the fatigue life function that falls within the FEL region becomes the effective upper limit of the region. This means that any combination of alternating stress and mean stress falling over the fatigue life function, but still within the FEL region, will have an endurance limit less than that of combinations falling on or below the line.

As shown in FIGS. 2 and 3, the method utilized by the system software 200 of the present invention can be described in two phases, I and II, with each phase comprising a series of steps. The purpose of Phase I is to evaluate the feasibility of utilizing the surface enhancement method for a given material system by determining the residual stress distributions that are attainable for the material as well as evaluating the performance of the material in its existing as well as treated condition. From this information a Fatigue Design Diagram can be constructed for the particular material system. Ultimately, Phase I results in a determination of the possible residual stress distributions that can be induced in the part in order to meet the desired performance criteria. Phase II entails the determination of an appropriate residual stress distribution based upon performance criteria, the component geometry, applied and residual stresses, and the evaluation of Phase I. Phase II also involves the design and development of the appropriate tooling and procedures necessary to implement the designed residual stress field and induce it in the material.

Referring to FIG. 2, a flowchart illustrating the structured methodology and design of the system software 200 of the present invention is shown. The application in which the part will be employed is first defined in step 202. The definition of the application takes into account a variety of stress related factors including the part's mechanical behavior, operating environment (temperature, atmosphere, service loads and frequency, etc.), any manufacturing requirements such as surface finish, production rate and unit cost, performance requirements such as service life and retirement criteria, and the part's failure history (location and mode of failure, frequency and environmental influence).

After the application in which the part will be employed is defined and inputted into the system 100 using the selected input device 108 (FIG. 1), the applied stress state is determined (step 204). The system software operates 200 to determine the applied stresses, both mean and alternating, are determined using conventional finite element analysis or by inputting direct measurement data that was obtained using strain gages, deflection, or other means and inputted into the system 100. The system 100 then operates to determine the maximum stress locations on the part, as well as the principal stresses.

In step 206, the existing residual stress state within the part is determined and the residual stresses in and around known failure locations and highly stressed failure prone locations are mapped and measured along the surface, as well as the subsurface. Principal stresses may be determined by the system 100 from the surface map and subsurface data. In addition, the system 100 may operate so that existing residual stress is determined for a part already placed in service and compared to the as manufactured part to assess if the residual stresses are subject to thermal or mechanical relaxation due to its operating environment.

In step 208, the combined stress state is determined. The combined stress state will be the summation of the applied and residual stress distributions. Ultimately, it is this combined stress state that will be reduced by a designed and induced residual stress distribution.

In step 210, the system 100 generates a fatigue design diagram for the selected material based upon the mechanical properties of the material. Possible residual stress distributions that may be imparted to the material utilizing the surface enhancement method under investigation are then determined, step 212, for a range of processing parameters and/or processing methods.

In step 214, an optimal residual stress field that will be induced in the part is generated by the system 100 utilizing the Fatigue Design Diagram in conjunction with fatigue life functions either empirically determined by Smith-Topper-Neuber Parameters or calculated using the Unified Fatigue Performance Model. First, the fatigue life function describing the locus of points having a given fatigue life is determined or calculated for a stress concentration factor of $K_t=1$ based on the fatigue properties of the material and the various applied stresses and a second fatigue life function is determined for a specific $K_t$ value determined by the part's service or performance criteria.

Figure 7:
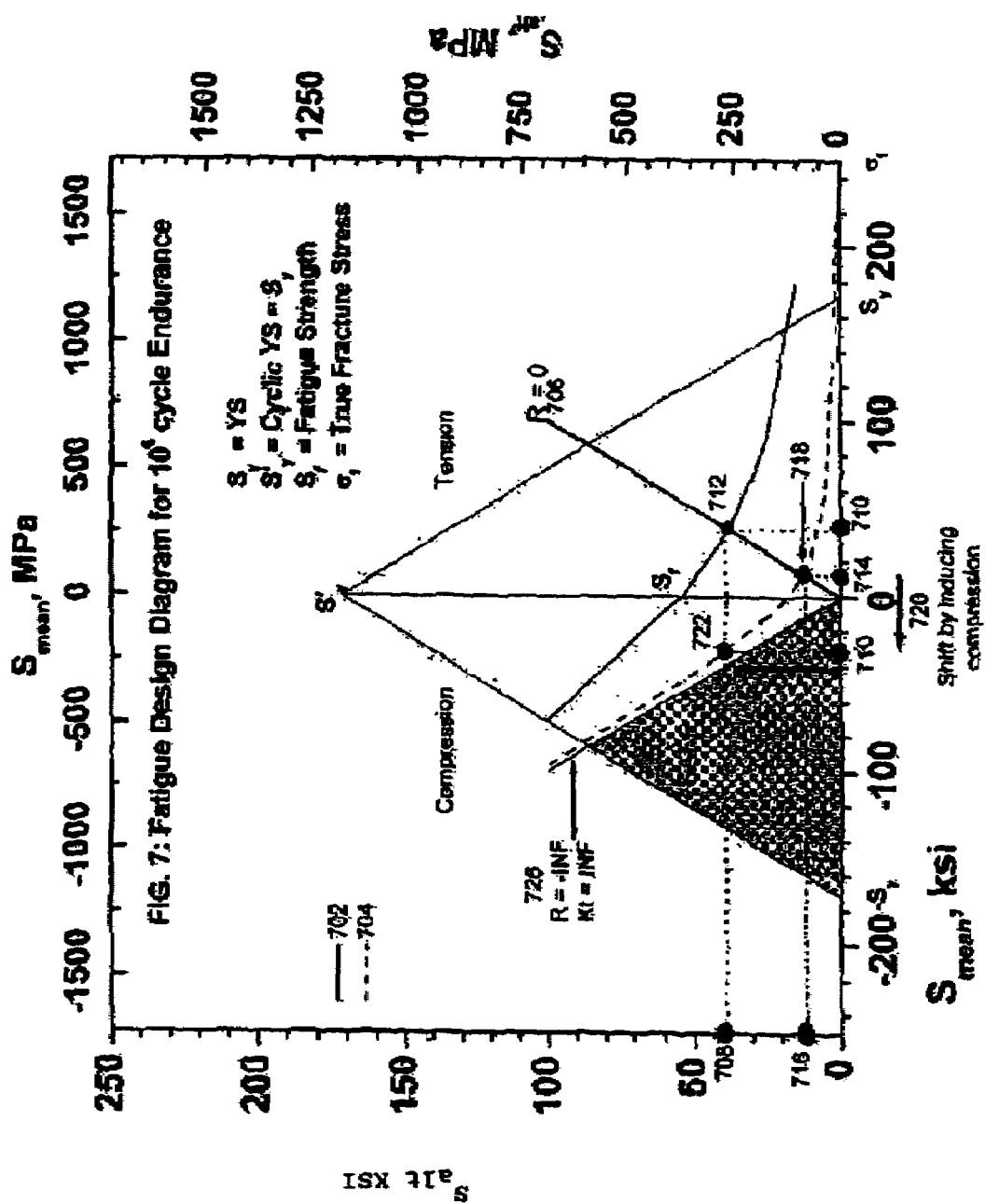
FIG. 7 shows a Fatigue Design Diagram of the alternating and mean stress levels commonly used in fatigue-limited design practice showing the Goodman Line and further modified to include Smith-Topper-Neuber function lines, verified by the Unified Fatigue Performance Model, which identify the combinations and magnitudes of applied and mean stress that can be tolerated for a given level of alternating stress and combination of applied mean and residual stress for a series of stress concentration factors, $K_t$.

In the example described herein, a ratio of minimum to maximum applied stress, R=0, and a $K_t=3$, as is customarily used for high cycle fatigue design of turbine engines has been used. Referring now to FIG. 7, the $K_t=1$ 702 and $K_t=3$ 704 fatigue life functions for a fatigue life of $10^6$ cycles, as determined by Smith-Topper-Neuber parameters, are plotted on the Fatigue Design Diagram along with a line R=0 706 that is defined by the ratio of minimum and maximum stresses that the part will experience during operation. Next, the alternating stress ($S_{alt}$) 708 and mean stress values ($S_{mean}$) 710 are determined at the intersection 712 of the $K_t=1$ fatigue life function 702 and the line R=0 706. Similarly, the mean stress 714 and the alternating stress 716 are determined for the intersection 718 of the $K_t=3$ fatigue life function 704 and the R=0 line 706. Comparing the allowed alternating and mean applied stress values for the $K_t=1$ fatigue life function 702 and the $K_t=3$ fatigue life function 704 it is obvious that, as the value of $K_t$ increases, the magnitudes of alternating and mean stresses the material is able to withstand while surviving for a given fatigue life are substantially diminished. Therefore, the material with a $K_t=3$ would be optimized if it were able to withstand an alternating stress as great as or exceeding the alternating stress 708 for the same material with a $K_t=1$ without the risk of failure within the proposed design life.

The system 100 operates to determine the minimum amount of induced residual compression 720 required to suppress the mean stress 714 for the $K_t=3$ 704 fatigue life function to achieve an alternating stress equal to the $K_t=1$ case 708 by shifting the mean stress 714 to the left, along the X-axis, until the alternating stress for the $K_t=3$ 704 fatigue life function equals that for the $K_t=1$ 708 case. As shown, an amount of compression 720 introduced in the material shifts the mean stress to a new mean stress value 710 such that the material can now handle a greater alternating stress without the risk of failure within the design life. For the specific example shown, the amount of compression 720 required for the $K_t=3$ fatigue life function was determined such that the alternating stress with compression 722 was of the same magnitude as the alternating stress 708 of the $K_t=1$ fatigue life function. The surface enhancement processing could be further optimized and the value of the sustainable alternating stress with compression 722 further increased to the maximum amount by increasing the magnitude of the compression induced 720 thus driving the mean stress further to the left and towards the apex of the safe region 724 where the sustainable alternating stress would be maximized for this particular material and applied stress system. For alternating stresses less than the $K_t=3$ 704 fatigue life function and falling within the safe zone 724, the surface of the sample will never be cycled into tension, and the fatigue life is theoretically infinite. The amount of compression required to obtain the desired magnitude for the applied alternating stress is the foundation for the designed optimal residual stress field to be induced in the part.

Referring again to FIG. 2, in step 216, the optimal residual stress field is induced in the part to obtain the desired compression. This may be accomplished by burnishing, deep rolling, laser shocking, shot peening or any other surface enhancement method capable of inducing compression in a part.

In step 218, the performance of the part with the induced residual stress is assessed relative to a part without the induced residual stress. Both parts are tested in the laboratory under conditions that simulate the operational environment. Testing methods may include, but are not limited to, measuring thermal relaxation, overload relaxation, high cycle fatigue and endurance limit determinations, crack growth analysis, stress corrosion cracking, foreign object damage resistance and corrosion fatigue. Based on this testing, the improvement achieved with respect to stress related failure mechanisms as a result of the induced compressive stress is assessed. Provided the improved part meets the established performance criteria, Phase I is completed. If not, the process is iterated beginning with the selection of optimal material parameters in the seventh control block 214.

Referring now to FIG. 3, a flow diagram is shown of the processes of Phase II of the method of the current invention. Phase II is concerned with determining the optimal residual stress field for the geometry of the part as well as the design of the appropriate tools and control software to implement the residual stress field in a manufacturing environment.

In step 302, the optimal residual stress field to be applied to the part is estimated taking into consideration the part geometry as well as the applied and residual stresses. Preferably, a finite element model of the part's geometry is used to combine residual and applied stress distributions and model the residual stress field that will cancel the residual tension contained at critical locations in the part. Finally, the life extension benefit conferred on the part by the introduction of designed residual stresses is calculated using fatigue life prediction means, linear elastic fracture mechanics, empirically determined effective initial flaw size characteristics of the final surface treatment, or a combination thereof.

In step 304, finite element analysis is used to calculate the equilibrating tension and distortion developed in the part as a result of the induced compression. The development of equilibrating tension may cause the part to distort and deform beyond acceptable engineering tolerances. By modeling the location and magnitude of the equilibrating tension for a given compressive residual stress pattern, it is possible to predict if such distortions will occur. Based on this model the compression induced in the part for the given application can be optimized, and the designed stress field adjusted to locate balancing tensile stresses away from applied tensile stresses, thereby avoiding the introduction of unacceptable tension in critical failure areas. If the model indicates that unacceptable levels of distortion will occur for the applied residual compressive stress field and corresponding equilibrating tension, the process is iterated beginning at step 302.

In step 306, a process to induce the appropriate magnitude and distribution of residual stress is determined. This includes the determination of an appropriate treatment process and parameters to induce the desired magnitude and distribution of residual stress, as well as control parameters and procedures for the process. The treatment process used to induce the residual stress may be shot peening, burnishing, deep rolling, laser shocking or any other means capable of inducing compression. The process may be either manually controlled or computer controlled.

In step 308, the process, control mechanisms and parameters are tested on mock samples intended to simulate the surface conditions and geometries of specific portions of actual parts. The samples are analyzed after processing to ensure that the appropriate dimensions, surface finish and other secondary surface requirements are achieved. The mock-up samples are further analyzed to ensure that the desired residual stress distribution has been induced.

Further, in step 308, the performance of the process is evaluated by determining if the treated mock parts exhibit improved life characteristics in a simulated service environment. Testing procedures may include, but are not limited to, measuring thermal relaxation, overload relaxation, high cycle fatigue and endurance limit determinations, crack growth analysis, stress corrosion cracking, foreign object damage resistance and corrosion fatigue.

In step 310, actual parts are manufactured according to the designed process for inducing residual stress. Following manufacturing, the parts are analyzed to verify that they have achieved the desired secondary surface requirements such as dimensions, roughness, surface finish, etc. The parts are then analyzed to verify that the appropriate magnitude and distribution of residual stress has been achieved.

In step 312, actual parts are tested under service or simulated service conditions to evaluate if the parts exhibit the required improved life characteristics. Preferably, the parts are tested under actual service conditions. The part's performance improvements are assessed relative to unprocessed parts subjected to the same service conditions. Assuming the parts demonstrate the required improved performance, the process designed for improving the part's resistance to stress related failure mechanisms is ready for implementation in the manufacturing environment 314.

Traditional design techniques have not accounted for the development of residual stresses in a part during manufacture. Such design techniques have either assumed that the part will be free from residual stresses upon completion or an excess of material is included in the design of a part in anticipation of treatments that may be required in order to offset the effects of residual stresses that may develop in the part during production. Design methodologies of this type may ultimately be detrimental to the performance of the part in applications where weight savings is critical. Similarly, such design methodologies may fail to take into account that the magnitude of the residual stresses in the part when added to the applied stresses may cause the part to fail prematurely. Furthermore, design techniques of this type neglect to take into consideration the total stress state of the part and thereby may not fully optimize the part for maximum performance and maximum life. Thus dealing with residual stresses in the traditional manner has a significant negative impact on the service life of the part as well as the overall cost of production.

While current design practices recognize the detrimental impact residual stresses may have on the combined stress state, they do not comprehensively and completely account for the evolution of these stresses in the design of a part so as to mitigate their impact and thereby optimize the performance of the part. In contrast, the current invention seeks to incorporate residual stresses from the onset of the design process so as to mitigate the detrimental effects of residual stresses and optimize the performance of the part. The method of the present invention utilizes a Fatigue Performance Diagram (modified Haigh Diagram) in conjunction with Smith Topper Neuber Fatigue Life Parameters and/or the Unified Fatigue Performance Model to fully take credit for residual stresses within a part. The Fatigue Performance Diagram differs from the commonly known Haigh Diagram in that it incorporates compressive stresses ($S_{mean}<0$) as well as several newly defined sub-regions. These sub-regions, the "safe region" for high cycle fatigue applications and the "fatigue elastic region" for low cycle applications, describe a locus of points where the part may safely operate for a specified service life under given conditions. Plotting Fatigue Life Functions derived from either the Smith Topper Neuber Fatigue Life Parameters or the Unified Fatigue Performance Model on the Fatigue Design Diagram will afford part designers heretofore unrealized capabilities. The Fatigue Life Functions can be used to accurately predict and characterize the service life of a part under given operating conditions. While traditional fatigue life prediction models include similar fatigue life functions, the capability of these models was limited based on the diagram they were used in conjunction with. In the current invention, by utilizing the Fatigue Life Functions in conjunction with the Fatigue Design Diagram, the fatigue life of the part can be optimized for the given application by manipulating the residual stress state of the part such that the total combined stress state falls within one of the newly established "safe" operating regions.

The current invention has significant advantages over such traditional methods of part design. By utilizing the Fatigue Design Diagram in connection with fatigue life functions, either derived from Smith-Topper-Neuber parameters or calculated with the Unified Fatigue Performance Model, an appropriate level of compressive residual stresses can be induced in the part thereby optimizing the part to withstand a maximum of applied stress while simultaneously improving its fatigue life and resistance to other stress induced failure mechanisms. Furthermore, using residual stress considerations as an initial design parameter to optimize the performance of the part often minimizes the use of excess material which is a common practice in traditional "over" design. This not only provides a significant weight savings in the part but also serves to lower production costs. In addition, the method of the current invention also provides a cost savings in that with enhanced service life it will no longer be necessary to replace parts as frequently thereby reducing labor as well as costly machine down time.

What is claimed is:

1. A method for designing a part comprising the steps of:
determining the total of applied and residual stress distributions of the part;
designing a residual stress distribution to be induced in the part to offset the effects of the total applied and residual stress distributions;
inducing the designed residual stress distribution in the part;
assessing the effectiveness of the induced residual stress distribution;
evaluating the effectiveness of the residual stress distribution; and
iterating the steps of designing a residual stress distribution to be induced in the part, inducing the designed residual stress distribution in the part and evaluating the effectiveness of the induced residual stress distribution in offsetting the effects of the total applied and residual stress distributions until an effective residual stress distribution is achieved.

2. The method of claim 1 further comprising the steps of:
calculating the necessary stress distribution and pattern to be induced in the part such that the part will meet desired performance criteria.

3. The method of claim 1 further comprising the steps of:
determining the appropriate processing steps and parameters for inducing the desired residual stress distribution in the part and inducing the desired residual stress distribution in the part using the determined processing steps and parameters.

4. The method of claim 1 wherein the total stress state of the component is determined by the additional steps of:
determining the existing residual stress distribution of the part by measurement;
calculating the anticipated applied stress distribution for the part using finite element analysis, direct measurement, or a combination thereof; and
determining the total stress distributions of the part by adding the existing residual stress distribution of the part to the anticipated applied stress distribution.

5. The method of claim 1 further comprises the steps of:
determining the appropriate processing steps and associated parameters to induce the designed stress distribution in the part; and
empirically measuring the amount of stress induced in the material.

6. The method of claim 1 wherein the designing step further comprises the steps of:
creating a finite element model of the geometry of the part;
creating a finite element model of the total stress state of the part;
superimposing the finite element model of the total stress state model on the finite element model of the geometry of the part; and
designing a residual stress field that will cancel the tensile stresses located at critical locations of the part.

7. The method of claim 1 wherein the stress distribution to be induced in the part is determined by utilizing linear elastic fracture mechanics, fatigue life prediction means, an empirically determined effective initial flaw size characteristic of the final surface treatment, or a combination thereof.

8. The method of claim 1 wherein designing the stress distribution to be induced in the part further comprises the steps of:
creating a Fatigue Design Diagram for the material from which the part is made;
establishing fatigue life functions for the material;
plotting the fatigue life functions on the Fatigue Design Diagram for various values of notch sensitivity $K_f$; and
extrapolating an appropriate value of compressive residual stress to be induced in the part from the Diagram so as to optimize the material's load bearing capabilities.

9. The method of claim 8 wherein the fatigue life functions are calculated using a Unified Fatigue Performance Model.

10. The method of claim 8 wherein the fatigue life functions are determined using Smith-Topper-Neuber parameters.

11. The method of claim 1 wherein inducing the designed residual stress is done by a process selected from the group consisting of burnishing, deep rolling, laser shocking, shot peening, and a combination thereof.

12. The method of claim 1 wherein assessing the impact of the induced residual stress distribution on material performance further comprises the steps of testing and measuring treated and untreated parts under simulated service conditions and comparing the results.

13. The method of claim 1 further comprises the steps of:
selecting the appropriate method of inducing the designed residual stress distributions in the part;
determining the appropriate treatment parameters;
determining the appropriate control parameters;
testing the manufacturing process on part samples; and
evaluating the part samples for process efficacy.

14. A method for designing a part comprising the steps of:
determining the total stress state of the part by adding the existing residual stress distribution of the part to the applied stress distribution of the part;
determining the amount of residual stress which can be induced in the material from which the part is manufactured;
modeling the total stress state acting on the material;
superimposing the modeled stress state on a model of the part;
identifying areas of the model which may be prone to failure as a result of localized tensile stresses;
designing a residual stress distribution to be induced in the part such that it will cancel the effects of localized tensile stresses while minimizing distortion of the part due to the induced stress;
utilizing a Fatigue Design Diagram in conjunction with fatigue life functions for various values of $K_f$ to determine the magnitude of compression to be induced in the part such that it will offset the localized tensile stresses and optimize the cyclic load bearing capabilities of the part;

determining the appropriate process and associated parameters to induce the designed residual stress distribution;

inducing the designed residual stress distribution in the part;

testing the part to assess the efficacy of the induced residual stress distribution; and implementing the process in the manufacturing environment.

15. The method of claim 14 wherein the fatigue life functions are calculated from the Unified Fatigue Performance Model.

16. The method of claim 14 wherein the fatigue life functions are determined from Smith-Topper-Neuber parameters.

17. A system for improving the resistance to stress induced failure of a part comprising:

a computer system having software for performing a method of improving the resistance to stress induced failure of a part;

wherein said method comprises the steps of:

inputting into the system the existing residual stress distribution of the part;

inputting into the system the part geometry and material properties, performing finite element analysis to calculate anticipated applied stress distribution of the part;

calculating the total stress state of the part; and determining the residual stress distribution to be induced in the part to maximize the resistance of stress induced failure of the part.

18. The system of claim 17 wherein the method further uses a fatigue design diagram in conjunction with fatigue life functions for various stress concentration factor values to determine the magnitude of residual stress to be induced in the part.

19. The system of claim 18 wherein the fatigue life functions are calculated from the Unified Fatigue Performance Model.

20. The system of claim 18 wherein the fatigue life functions are determined by using Smith-Topper-Neuber parameters.

* * * * *